US009704574B1

(12) United States Patent
Shamis

(10) Patent No.: US 9,704,574 B1
(45) Date of Patent: Jul. 11, 2017

(54) METHOD AND APPARATUS FOR PATTERN MATCHING

(71) Applicant: Marvell International Ltd., Hamilton (BM)

(72) Inventor: Michael Shamis, Netanya, IL (US)

(73) Assignee: Marvell International Ltd., Hamilton (BM)

( * ) Notice: Subject to any disclaimer, the term of this patent is extended or adjusted under 35 U.S.C. 154(b) by 428 days.

(21) Appl. No.: 14/331,472

(22) Filed: Jul. 15, 2014

Related U.S. Application Data

(60) Provisional application No. 61/933,670, filed on Jan. 30, 2014, provisional application No. 61/914,662, filed on Dec. 11, 2013, provisional application No. 61/859,072, filed on Jul. 26, 2013.

(51) Int. Cl.
*G06F 12/00* (2006.01)
*G11C 15/04* (2006.01)
*G06F 17/30* (2006.01)

(52) U.S. Cl.
CPC ........ *G11C 15/04* (2013.01); *G06F 17/30982* (2013.01); *G06F 2212/00* (2013.01)

(58) Field of Classification Search
CPC ... G06F 17/30982; G06F 2212/00–2212/7211; G11C 15/04; G11C 15/00–15/06
See application file for complete search history.

(56) References Cited

U.S. PATENT DOCUMENTS 6,362,992 B1 * 3/2002 Cheng .................... G11C 15/04 365/189.07
2005/0031077 A1 * 2/2005 Avnery .................... A61L 2/08 378/64
2013/0031077 A1 * 1/2013 Liu .......................... G06F 7/02 707/706
2013/0246698 A1 * 9/2013 Estan .................. G11C 7/1072 711/108
2014/0207897 A1 * 7/2014 Kodama ................ H04L 49/10 709/213
2016/0269295 A1 * 9/2016 A S ...................... H04L 47/125

* cited by examiner

*Primary Examiner* — Reginald Bragdon
*Assistant Examiner* — Mehdi Namazi

(57) ABSTRACT

Aspects of the disclosure provide an apparatus that includes a key generator, a first memory, a second memory, and a controller. The key generator is configured to generate a first search key, and one or more second search keys in response to a pattern. The first memory is configured to compare the first search key to a plurality of entries populated in the first memory, and determine an index of a matching entry to the first search key. The second memory is configured to respectively retrieve one or more exact match indexes of the one or more second search keys from one or more exact match pattern groups populated in the second memory. The controller is configured to select a search result for the pattern from among the index output from the first memory and the one or more exact match indexes output from the second memory.

20 Claims, 4 Drawing Sheets

METHOD AND APPARATUS FOR PATTERN MATCHING

INCORPORATION BY REFERENCE

This present disclosure claims the benefit of U.S. Provisional Application No. 61/859,072, "Hybrid TCAM (HTCAM)" filed on Jul. 26, 2013, U.S. Provisional Application No. 61/914,662, "Hybrid TCAM (HTCAM)" filed on Dec. 11, 2013, and U.S. Provisional Application No. 61/933,670, "Hybrid TCAM (HTCAM)" filed on Jan. 30, 2014, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, content addressable memory (CAM) is used in various applications to provide a relatively fast searching capability. In an example, a network device, such as a network switch, a router and the like includes a ternary CAM (TCAM) to store criteria for a plurality of switching rules. In an example, a criterion includes a range requirement that occupies one or more TCAM entries, and addresses of the TCAM entries point to action codes associated with the criterion. When the network device receives a packet, selected attributes of the packet are extracted to form a search key. The search key is compared with plural TCAM entries to find a matching entry from among the TCAM entries. Typically, comparison of the search key against the plural TCAM entries is performed simultaneously. The address of the matching entry points to an action code. According to the action code, the network device takes specified actions on the packet.

SUMMARY

Aspects of the disclosure provide an apparatus that includes a key generator, a first memory, a second memory, and a controller. The key generator is configured to generate a first search key, and one or more second search keys in response to a pattern. The first memory is configured to compare the first search key to a plurality of entries populated in the first memory, and determine an index of a matching entry to the first search key. The second memory is configured to respectively retrieve one or more exact match indexes of the one or more second search keys from one or more exact match pattern groups populated in the second memory. The controller is configured to select a search result for the pattern from among the index output from the first memory and the one or more exact match indexes output from the second memory.

In an embodiment, the first memory is a content addressable memory (CAM), and the second memory is configured to store the one or more exact match pattern groups in the form of at least one of hash tables, multi-hash tables and a binary content addressable memory (BCAM).

According to an aspect of the disclosure, the first memory and the second memory are configured to operate in parallel to respectively output the index of the matching entry to the first search key and the one or more exact match indexes of the one or more second search keys.

In an embodiment, the controller is configured to select the search result according to priority information of the matching entry and the one or more exact matches.

According to an aspect of the disclosure, an exact match pattern group includes a plurality of entries, and each entry is configured to store an entry key with associated priority information. The exact match pattern group is configured to output an index of an entry and priority information of the entry when an entry key of the entry matches a second search key for the exact match pattern group. Each exact match pattern group includes a random access memory that is accessed based on a hash look-up of a second key.

In an embodiment, the apparatus includes a driver configured to receive a rule with one or more classifiers, and to select one of the first memory and the second memory to populate the rule to maximize a usage of the second memory. In an example, the driver is configured to add a new exact match pattern group in the second memory to fit the classifiers of the rule, and move entries in the first memory with the same classifiers as the rule to the new exact match pattern group in the second memory in order to free space in the first memory that is more expensive than the second memory. In another example, the driver is configured to move a smallest exact match pattern group from the second memory to the first memory in order to have enough space to add a new exact match pattern group with larger space requirement in the second memory for the rule.

Aspects of the disclosure provide a method for search. The method includes generating a first search key, and one or more second search keys in response to a pattern, comparing the first search key to a plurality of entries populated in a first memory to determine an index of a matching entry to the first search key, respectively retrieving one or more exact match indexes of the one or more second search keys from one or more exact match pattern groups populated in a second memory, and selecting a search result for the pattern from among the index output from among the first memory and the one or more exact match indexes output from the second memory.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
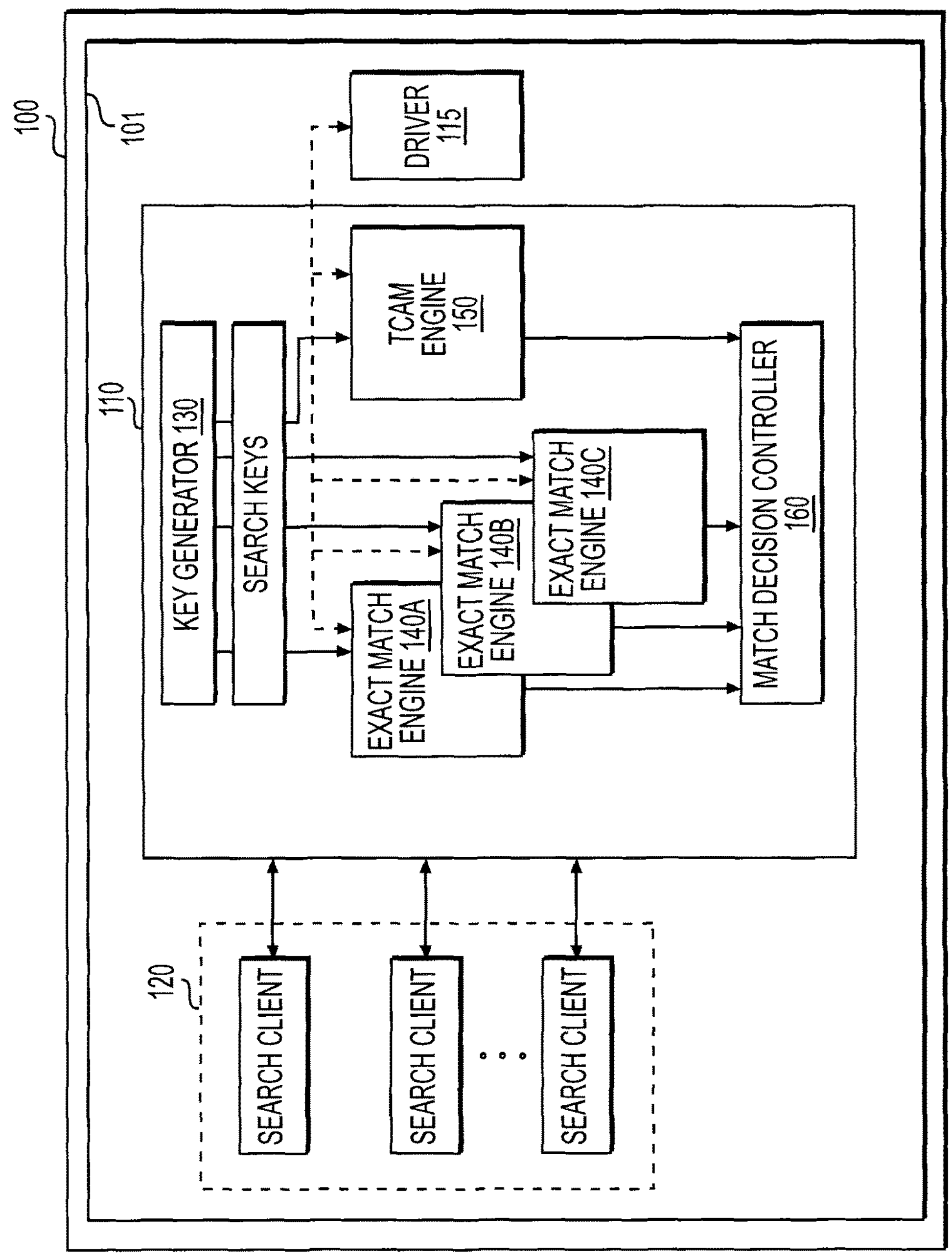
FIG. 1 shows a block diagram of an electronic device 100 according to an embodiment of the disclosure.

FIG. 1 shows a block diagram of an electronic device example 100 according to an embodiment of the disclosure. The electronic device 100 includes a search engine 110. The search engine 110 includes a key generator 130, multiple sub-engines, such as a plurality of exact match engines 140A-140C, a ternary content addressable memory (TCAM)

engine 150, and the like, and a match decision controller 160. These elements are coupled together as shown in FIG. 1.

According to an aspect of the disclosure, the exact match engines 140A-140C use high density memory compared to the TCAM engine 150, and are configured to perform parallel search operations with the TCAM engine 150. In an embodiment, the key generator 130 receives a pattern for search, generates search keys from the pattern respectively for the multiple sub-engines, and provides the search keys respectively to the multiple sub-engines. For example, the key generator 130 generates a first search key for the TCAM engine 150 and a plurality of second search keys respectively suitable for the plurality of exact match engines 140A-140C. The TCAM engine 150 searches among entries in the TCAM engine 150 for an entry that matches the first search key, and outputs a first result. In an example, when multiple entries in the TCAM engine 150 match the first search key, the TCAM engine 150 selects the one with the highest priority to generate the first result. The exact match engines 140A-140C respectively search among entries in the exact match engines 140A-140C for entries that exactly match the second search keys, and output second results. The match decision controller 160 then selects a search result for the pattern from the first result and the second results, for example based on priority information.

It is noted that, in an embodiment, the first search key and the second search keys are the same, thus the same key is used to search against the entries in the TCAM engine 150 as well as the entries in each of the exact match engines 140A-140C. The match decision controller 160 determines a desired search result among multiple results from the TCAM engine 150 and the exact match engines 140A-140C, based for example on priority information and outputs the desired search result as an output of the search engine 110.

The electronic device 100 can be any suitable device that uses a search engine to match the received pattern to stored data patterns. In the FIG. 1 example, the electronic device 100 is a network device 100, such as a network switch, a router, and the like. The network device 100 includes a packet processor 101 configured to process packets, in an embodiment. For example, the network device 100 receives incoming packets from other devices via ingress ports (not shown), and the packet processor 101 processes the packets, and determines actions on the packets, such as forwarding a packet to one or more egress ports (not shown) to output the packet, filtering a packet, statistics gathering for network management/security and the like based on attributes of the packets.

According to an aspect of the disclosure, the packet processor 101 determines actions on packets based on rules. In an embodiment, a rule includes criteria and an action code associated with the criteria. The criteria specify data patterns for attributes. In an example, the data patterns include range requirement and/or exact match requirement. In an embodiment, a switching rule would be expressed, for example, in plain English as "permit forwarding a packet with source address 172.15.5.0, TCP port number between 1 to 14". The switching rule includes a source address criterion, a protocol (TCP) criterion, a TCP port number criterion, and an action code "permit forwarding" in association with the criteria. The source address criterion and the protocol criterion are exact match requirements that require specific packet fields to exactly match the values specified in the criteria. The TCP port number criterion is a range requirement that requires a specific packet field is in a range specified in the criterion. When a received packet satisfies all the criteria, an action according to the action code can be taken on the received packet.

According to an aspect of the disclosure, criteria of a rule specify values for a set of classifiers. Each classifier is defined by a set of properties of a pattern, such as an offset from a start of the pattern, a size, and a mask, or pre-defined properties, such as source IP address, and the like.

When the criteria for a rule are all exact match requirements, the rule is referred to as an exact match rule. It is noted that a non-exact match rule can be expanded into a plurality of exact match rules. According to an aspect of the disclosure, the ratio of exact match rules increases with the total number of rules, thus a device may have a large number of exact match rules. For example, in various applications, such as Internet small computer system interface (iSCSI), FCoE initialization protocol (FIP), ARP snooping, DHCP snooping, and the like, when the number of rules is about one thousand, in an embodiment, the ratio of exact match rules to the total number of rules is over 80%. In the FIG. 1 example, the exact match engines 140A-140C are configured to be able to store the large number of exact match rules, and operate in parallel with the TCAM engine 150 for search operation, thus the search engine 110 efficiently utilizes various memories for the rules.

In the FIG. 1 example, the packet processor 101 includes a processing circuit 120 coupled with the search engine 110. In an embodiment, the processing circuit 120 includes a plurality of search clients that require search service from the search engine 110. In an example, the search clients are packet processing stages, and one or more packet processing stages are coupled with the search engine 110 to determine one or more action codes for a packet.

In an example, a packet includes a header of 128 bytes. The packet processing stages respectively parse a portion of the header. Then, the search engine 110 respectively searches for action codes based on the parsed portions of the header. The search results can be suitably combined to determine a suitable action code for the packet.

According to an aspect of the disclosure, criteria are stored in the search engine 110, and the action codes are stored separately from the criteria. In an embodiment, the criteria are stored in the search engine 110 as entries that are indexed and the action codes are stored in a memory (not shown) at address that are pointed by indexes of the entries. In an example, the index of an entry points to an address in the memory that stores an action code associated with the criteria.

Various criteria are stored in the search engine 110. The exact match engines 140A-140C and the TCAM engine 150 in the search engine 110 store criteria using different techniques, and each achieves certain advantages for certain criteria compared to the other.

In an example, the TCAM engine 150 includes TCAM blocks and auxiliary circuits, such as a priority encoder, and the like. Each TCAM block includes a plurality of TCAM entries. A TCAM entry includes a plurality of TCAM cells that each is configured to store ternary states, and thus each TCAM entry is able to store a range requirement representable in a binary aligned form. For example, [16, 31] (a range of integers inclusive from sixteen to thirty one) is represented in the binary aligned form as "01XXXX", where "X" represents a mask that matches both binary "0" and binary "1". Thus, [16, 31] is storable in a single entry of the TCAM engine 150. In another example, [32, 32] is an exact match requirement, and is also representable in the binary aligned form as "100000", thus [32, 32] is storable in a single entry of the TCAM engine 150. In another example, [16, 32] is expandable as a combination of [16, 31] and [32, 32] that are represented in the binary aligned form as "01XXXX" and "100000", thus the TCAM engine 150 needs to use two entries to store [16, 32].

Further, according to an aspect of the disclosure, the exact match engines 140A-140C use other suitable technology, such as hash tables, multi-hash tables, binary content addressable memory (BCAM), and the like to store the criteria in the form of exact match requirements, and perform exact match operations. In an example, the exact match engines 140A-140C use high density and low power memory, such as static random access memory (SRAM), dynamic random access memory (DRAM), and the like to store the criteria in the form of exact match entries and use hash based look-up to search for an exact match entry, such as disclosed in Applicant's co-pending application Ser. No. 13/737,608, filed Jan. 9, 2013, which is incorporated herein by reference in its entirety.

In an embodiment, the search engine 110 includes SRAM memory blocks with suitable peripheral circuit components to enable multiple parallel look-ups into the SRAM memory blocks. Thus, the SRAM memory blocks can be configured to form the exact match engines 140A-140C. For example, the SRAM memory blocks are configured to form a plurality of exact match pattern groups (EMPGs) that perform the functions of the exact match engines 140A-140C. It is noted that other suitable memory blocks, such as DRAM memory blocks, and the like can be used in the place of the SRAM memory blocks.

A plurality of rules is associated with a specific EMPG when a same search key is used for searching from the plurality of rules. In an example, an EMPG is configured according to a set of classifiers, such as a source IP address classifier and a protocol classifier. When criteria of an exact match rule specifies values for the source IP address and the protocol, the exact match rule can be associated with the EMPG.

In an embodiment, an EMPG is implemented as a hash module. In an example, the hash module includes a memory space allocated for a hash table and a hash register associated with the hash table. The hash table includes a plurality of hash entries. The hash register stores a hash code word for hash. When a search key for the hash table is received, the search key is hashed according to the hash code word to determine a specific hash entry, such as an index to the hash entry, in the hash table. The specific hash entry is then accessed.

Generally, a hash table is a data structure used to implement an associative array that maps keys to values. In an example, the hardware of the search engine 110, such as memory blocks and peripheral circuits, is configurable, and can be configured to perform functions of one or more (e.g., $2^N$, N is a whole number) hash tables. Each configured hash table is referred to as a virtual hash table.

In an embodiment, the hash module is formed of a plurality of hash tables (e.g., virtual hash tables). When some hash tables are used for an application, such as an access control list (ACL) application that specifies a list of permissions of users or systems to access an object, the rest of the hash tables can be used for other applications. In an example, the hash module is configured to have a single hash code word to handle a single search key. In another example, the hash module is configured to have multiple hash code words to handle respective search keys for the hash tables. In an example, the hash module is configured to support the hash tables to operate in parallel. In another example, the hash module does not support the hash tables to operate in parallel.

According to an aspect of the disclosure, the SRAM memory is configured to support, in hardware, multiple hash look-ups in parallel. For example, the SRAM memory is configured to be able to access (e.g., read) multiple addresses in an access cycle. The SRAM memory can be software-configured to form multiple EMPGs. In an example, the electronic device 100 includes a driver 115 configured to drive the SRAM memory to form the multiple EMPGs, and associate rules with the multiple EMPGs. The multiple EMPGs then perform look-ups in parallel in response to their respective search keys.

The key generator 130 is configured to support the architecture of search engine 110. In an embodiment, the key generator 130 is configured to generate search keys based on a pattern defining what to search in a loop-up and a profile defining where to search, such as which hash modules, which hash tables within a hash module, and the like. In an example, the profile includes a profile identification that is defined by a search client.

In an example, when a hash module handles a single search key, the key generator 130 generates and provides one search key to the hash module in a search cycle.

In another example, the hash module includes a first hash table and a second hash table, and is configured to have a first hash code word for the first hash table and a second hash code word for the second hash table. The first hash table and the first hash code word are configured to look-up according to source and destination IP addresses, and the second hash table and the second hash code word are configured to look-up according to MAC source and destination addresses. Then, the key generator 130 is configured to generate two different search keys respectively for the first hash table and the second hash table.

In another example, a profile identification is mapped to multiple hash modules. The key generator 130 is configured to generate same search keys for the multiple hash modules.

In an embodiment, a hash module has a specific memory size defined by hardware. The hash tables (e.g., virtual hash tables) may have variable sizes, and can be configured by software. In an example, the rules to be stored in the search engine 110 are analyzed, for example by the driver 115, to determine the sizes of the virtual hash tables in order to optimize the hardware usage. Then the hardware is configured to form the virtual hash tables of the determined sizes. Using virtual hash tables can improve hardware usage efficiency, and allows more parallel lookups, for example a first layer of parallel lookups in a same hash module and a second layer of parallel lookups in multiple hash modules. In an example, multiple-layer parallel lookup not only improves throughput of the search engine 110, but also improves capacity of the search engine 110. For example, when several applications use the same lookup, using the multiple-layer parallel lookups prevents Cartesian multiplication of rules.

According to an aspect of the disclosure, the match decision controller 160 is configured to receive matches from all hash modules related to the look-up and priority information of the matches, and select one match with the highest priority.

According to an aspect of the disclosure, to store exact match rules, the exact match engines 140A-140C occupy less silicon area than the TCAM engine 150. In an example, accumulatively, an average silicon area ratio for a TCAM entry and a SRAM entry is 8:1. However, the TCAM engine

150 can achieve higher efficiency than the exact match engines 140A-140C for certain range rules.

According to another aspect of the disclosure, the exact match engines 140A-140C consume considerably less power than the TCAM engine 150 during operation because a search in the TCAM engine 150 simultaneously looks for a match against all entries of the TCAM array, while a search in the exact match engines 140A-140C accesses a small portion of the SRAM memory.

According to an aspect of the disclosure, the driver 115 is configured to have configuration information about the TCAM engine 150 and the hardware information for configuring the exact match engines 140A-140C. The driver 115 provides information to other components, such as the key generator 130, the match decision controller 160, and the like to enable the other components to operate with the TCAM engine 150 and the exact match engines 140A-140C. In an example, the driver 115 is configured to dynamically control rule storage, such as forming a new EMPG, optimizing space allocations to EMPGs, de-allocation for a specific EMPG, and the like to manage the search engine resources. In an example, the driver 115 is implemented as integrated circuits. In another example, the driver 115 is implemented as software instructions executed by a processor.

According to an aspect of the disclosure, the driver 115 is configured to maximize the storage usage of the exact match engines 140A-140C, thus TCAM entries are saved to store more range requirement based rules. In addition, a user of the electronic device 100 does not need to be aware of the rule storage configuration in the search engine 110. Further, in an example, each of the exact match engines 140A-140C is able to complete a search in each search cycle of the TCAM engine 150 and the exact match engines 140A-140C are configured to operate in parallel with the TCAM engine 150, and thus in an example, the user experience remains the same.

Figure 2:
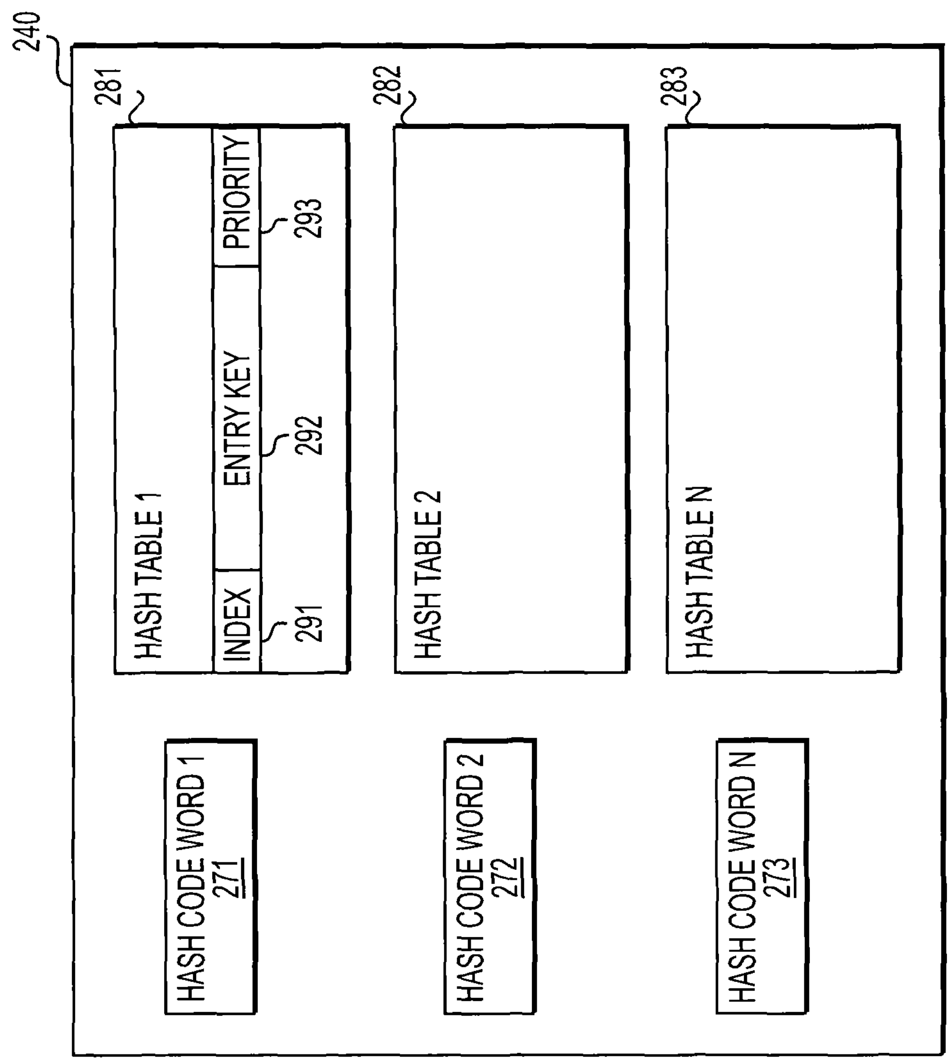
FIG. 2 shows a block diagram of a hash module 240 according to an embodiment of the disclosure.

FIG. 2 shows a block diagram of a hash module 240 according to an embodiment of the disclosure. In an embodiment, the hash module 240 is implemented in a memory block, such as an SRAM memory block, a DRAM memory block, and the like. In the FIG. 1 example, each of the exact match engines 140A-140C can be implemented as a hash module 240, in an embodiment.

In an embodiment, the hash module 240 has a specific memory size, such as 16K, 32K, 64K, and the like, defined by hardware. In the FIG. 2 example, the hash module 240 is configured to form a plurality of hash tables 281-283. In an example, the hash tables 281-283 are virtual hash tables that are configurable according to rules to be stored. Each hash table includes a plurality of hash entries. Each hash entry has an index 291, and stores an entry key 292 and priority information 293 associated with the hash entry. In an example, the hash tables 281-283 have variable sizes, and can be reconfigured by software. Further, the hash module 240 includes a plurality of hash code words 271-273 respectively associated with the hash tables 281-283. In an embodiment, the hash tables 281-283 are configured to perform parallel lookups in response to different search keys and thus, each hash table can be configured as an exact match engine. In the FIG. 1 example, the exact match engines 140A-140C can be implemented respectively as the hash tables 281-283 in another embodiment.

In an example, the first hash table 281 and the first hash code word 271 are configured to look-up according to source and destination IP addresses, and the second hash table 282 and the second hash code word 272 are configured to look-up according to MAC source and destination addresses. The first hash table 281 stores exact match rules specifying values for the source and destination IP addresses. In the example, the entry key 292 is a combination of an exact source IP address and an exact destination IP address for an exact match rule, and the index 291 is a hash result of the combination using the hash code word 271.

During operation, in an example, search keys are respectively generated and provided to the hash module 240. For example, a first search key is generated as a combination of a source IP address and a destination IP address in a header of a packet, and a second search key is generated as a combination of a MAC source address and a MAC destination address in the header of the packet.

Then, in an embodiment, the search keys are respectively hashed using the hash code words 271-273 to access the hash tables 281-283. Specifically, the first search key is hashed using the hash code word 271 to determine an index to an entry in the hash table 281. In an example, when the first search key exactly matches the entry key 292, the hash result of the first search key is the index 291. Then, the index 291 with the priority 293 are output as the exact match result from the hash table 281.

Figure 3:
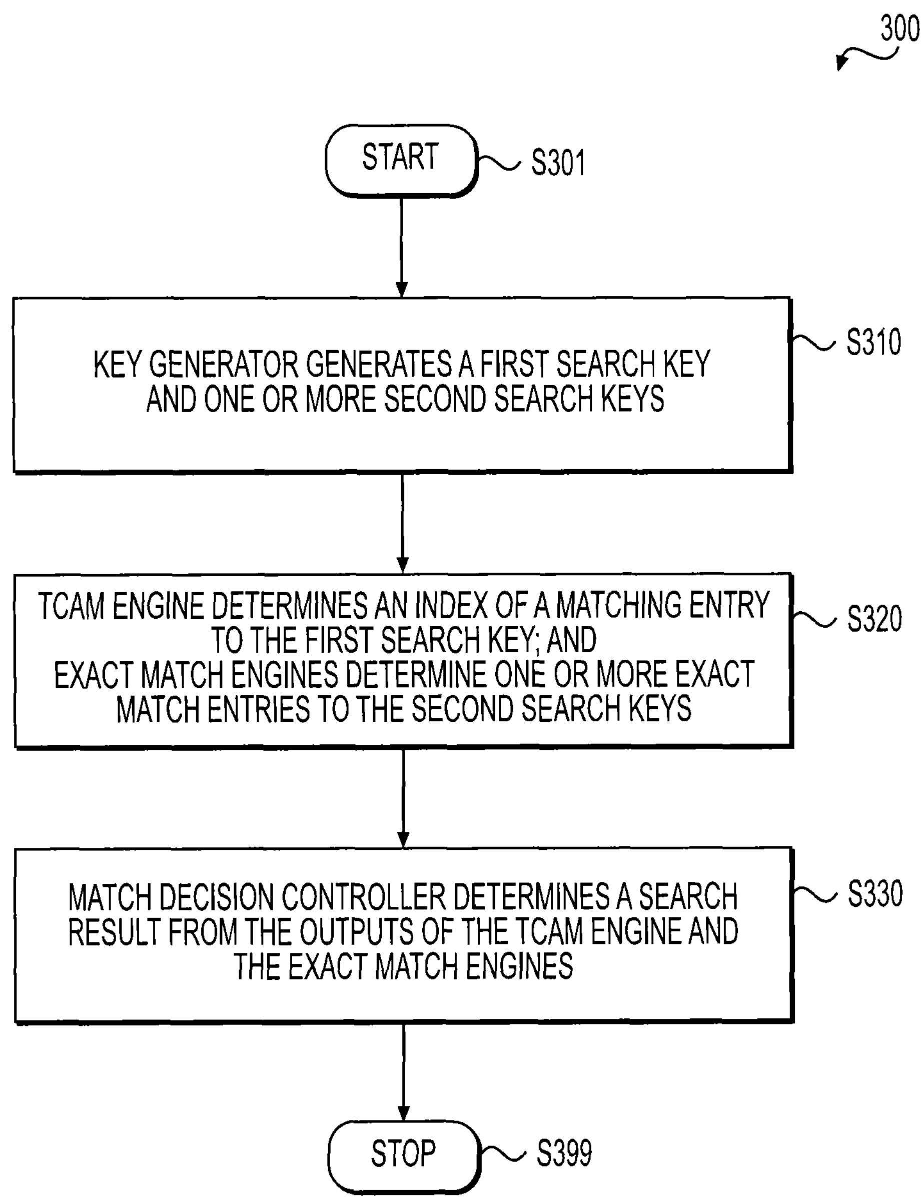
FIG. 3 shows a flow chart outlining a process example 300 for a search according to an embodiment of the disclosure.

FIG. 3 shows a flow chart outlining a process example 300 according to an embodiment of the disclosure. In an example, the process is executed in a search engine, such as the search engine 110. The process starts at S301 and proceeds to S310.

At S310, a key generator generates a first search key for a TCAM engine and one or more second search keys for one or more exact match engines. In the FIG. 1 example, the search engine 110 receives a pattern, such as a header of a packet, for rule search. In an example, the search engine 110 also receives one or more profile identifications. The key generator 130 generates a first search key for the TCAM engine 150 and one or more second search keys for the exact match engines 140A-140C based on the pattern and the profile identifications. It is noted that the first search key and the second search keys can be different search keys or can be the same search key.

At S320, the TCAM engine determines an index of a matching entry to the first search key and the exact match engines determine one or more exact match entries to the second search keys. In the FIG. 1 example, the TCAM engine 150 searches for an entry that matches the first search key, and outputs a first result. The exact match engines 140A-140C respectively search for entries that exactly match the second search keys, and output second results that include the indexes of the exact match entries and the priorities of the exact match entries.

At S330, a match decision controller determines a search result selected from the outputs of the TCAM engine and the exact match engines. In the FIG. 1 example, the match decision controller 160 compares the priorities of the exact match entries, and selects the one with the highest priority as the search output of the search engine 110. In an example, when the exact match engines 140A-140C do not find any exact match entry, the match decision controller 160 selects the output from the TCAM engine 150 as the search output of the search engine 110.

Then, the process proceeds to S399 and terminates.

Figure 4:
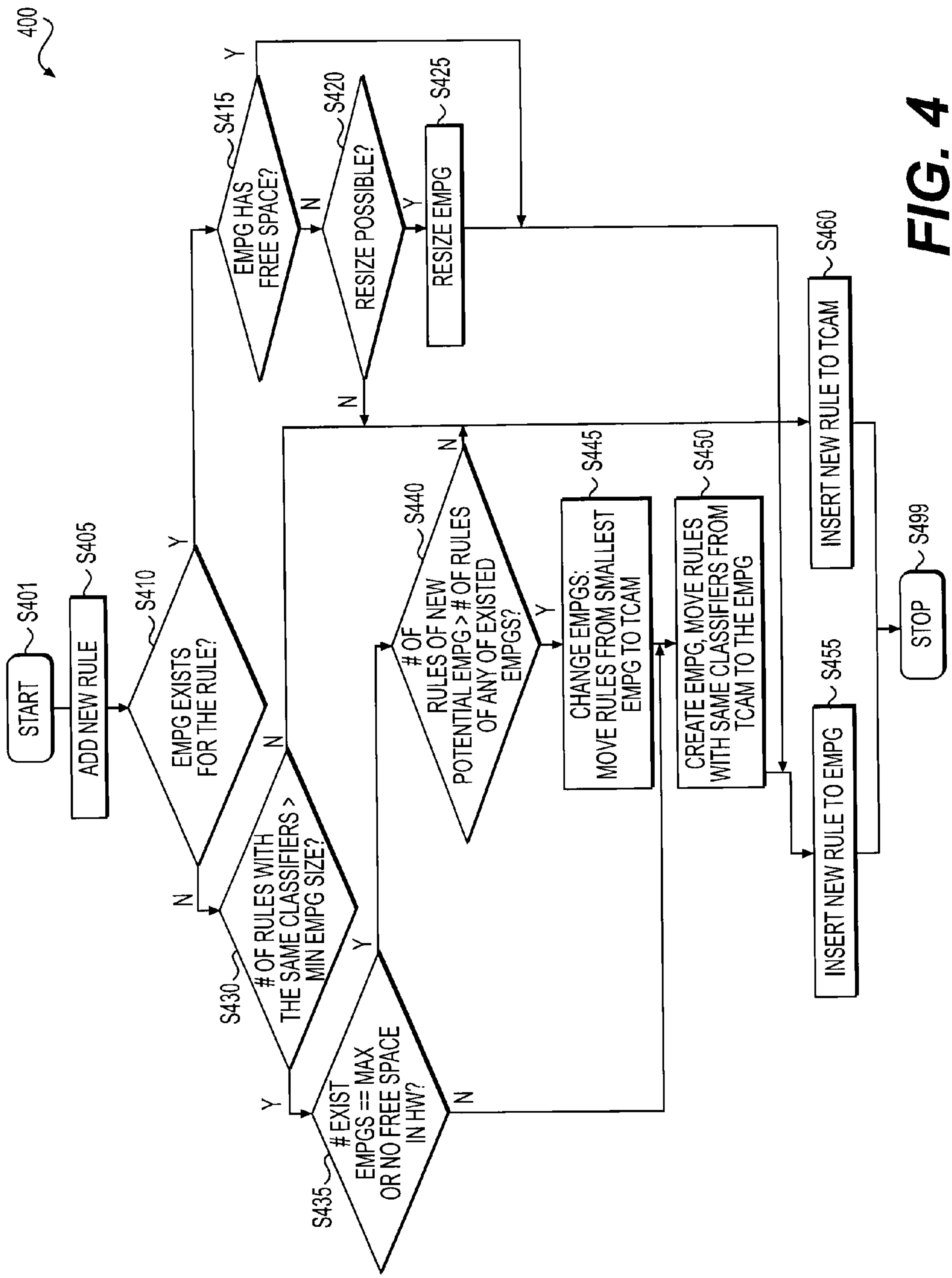
FIG. 4 shows a flow chart outlining a process example 400 for inserting a new rule according to an embodiment of the disclosure.

FIG. 4 shows a flow chart outlining a process example 400 for populating rules in a CAM based engine or an exact match based engine according to an embodiment of the disclosure. In an example, the process is executed by the driver 115 to dynamically manage the rule storage in the TCAM engine 140 or the plurality of exact match engines 140A-140C to improve capacity of rule storage in the search engine 110. The process starts at S401 and proceeds to S405.

At S405, a new rule is received. In the Fig. example, the driver 115 receives a new rule, for example from a network administration, to be added into the search engine 110. The new rule has one or more classifiers.

At S410, the process proceeds based on a determination whether an exact match pattern group (EMPG) exists for the rule. In the FIG. 1 example, the driver 115 determines whether one of the exact match engines 140A-140C has the same classifiers as the new rule, when one EMPG, for example the exact match engine 140A has the same classifiers as the new rule, the new rule belongs to the same EMPG as the exact match engine 140A, the process proceeds to S415; otherwise, when none of the EMPGs has the same classifiers as the new rule, the process proceeds to S430.

At S415, the process proceeds based on a determination whether the EMPG has free space. When the EMPG has free space, the process proceeds to S455; otherwise, the process proceeds to S420.

At S420, the process proceeds based on a determination whether the EMPG can be resized. When the EMPG can be resized, the process proceeds to S425; otherwise, the process proceeds to S460 whereat the new rule is inserted to the TCAM engine.

At S425, the EMPG is resized to increase memory space. Then, the process proceeds to S455.

At S430, the process proceeds based a determination whether a number of rules with the same classifiers as the new rule is larger than a minimum EMPG size. In an example, the driver 115 has a predetermined minimum EMPG size as a threshold value. When, in the TCAM engine 150, the number of exact match rules with the same classifiers as the new rule is larger than the minimum EMPG size, the process proceeds to S435; otherwise, the process proceeds to S440.

At S435, the process proceeds based on a determination whether the number of existing EMPGs reaches a maximum limit, or whether there is no more free space in hardware. In the FIG. 1 example, the hardware (e.g., SRAM memory blocks and peripheral circuit components) supports EMPGs up to a maximum limit. When the number of existing EMPGs already reaches the maximum limit, or when the memory does not have free space, the process proceeds to S440; otherwise, the process proceeds to S450.

At S440, the process proceeds based on a determination whether the number of exact match rules in a new potential EMPG is larger than a number of exact match rules of one of the existing EMPGs. When the number of exact match rules in the new potential EMPG is larger than a number of rules of one existing EMPG, the process proceeds to S445; otherwise, the process proceeds to S460.

At S445, an EMPG, such as an EMPG with the smallest number of exact match rules, is moved to the TCAM engine. In the FIG. 1 example, the driver 115 moves the exact match rules in an EMPG with the smallest number of rules to the TCAM engine 150 and de-allocates the memory space for the EMPG. In an example, the driver 115 also informs the key generator 130 and the match decision controller 160 of the configuration changes.

At S450, a new EMPG is created. In the FIG. 1 example, the driver 115 allocates memory space suitable for the classifiers of the new rule to a new EMPG, and moves exact match rules in the TCAM engine with the same classifiers as the new rule to the new EMPG. In an example, the driver 115 also informs the key generator 130 and the match decision controller 160 of the configuration changes.

At S455, the new rule is inserted in the EMPG. Then the process proceeds to S499 and terminates.

At S460, the new rule is inserted in the TCAM engine, and the process proceeds to S499 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An apparatus, comprising:

a key generator configured to generate a first search key, and one or more second search keys in response to a pattern;

a first memory configured to compare the first search key to a plurality of entries populated in the first memory, and determine an index of a matching entry to the first search key;

a second memory configured to respectively retrieve one or more exact match indexes of the one or more second search keys from one or more exact match pattern groups populated in the second memory; and a controller configured to select a search result for the pattern from among the index output from the first memory and the one or more exact match indexes output from the second memory.

2. The apparatus of claim 1, wherein the first memory is a content addressable memory (CAM).

3. The apparatus of claim 1, wherein the second memory is configured to store the one or more exact match pattern groups in the form of at least one of hash tables, multi-hash tables and a binary content addressable memory (BCAM).

4. The apparatus of claim 1, wherein the first memory and the second memory are configured to operate in parallel to respectively output the index of the matching entry to the first search key and the one or more exact match indexes of the one or more second search keys.

5. The apparatus of claim 1, wherein the controller is configured to select the search result according to priority information of the matching entry and the one or more exact match indexes.

6. The apparatus of claim 1, wherein an exact match pattern group includes a plurality of entries, and each entry is configured to store an entry key with associated priority information.

7. The apparatus of claim 6, wherein the exact match pattern group is configured to output an index of an entry and priority information of the entry when an entry key of the entry matches a second search key for the exact match pattern group.

8. The apparatus of claim 1, wherein an exact match pattern group includes random access memory that is accessed based on a hash look-up of a second key.

9. The apparatus of claim 1, further comprising:

a driver configured to receive a rule with one or more classifiers, and to select one of the first memory and the second memory to populate the rule to maximize a usage of the second memory.

10. The apparatus of claim 9, wherein the driver is configured to add a new exact match pattern group in the second memory to fit the classifiers of the rule, and move entries in the first memory with the same classifiers as the rule to the new exact match pattern group in the second memory.

11. The apparatus of claim 9, wherein the driver is configured to move a smallest exact match pattern group to the first memory in order to have enough space to add a new exact match pattern group in the second memory for the rule.

12. A method, comprising:

generating a first search key, and one or more second search keys in response to a pattern;

comparing the first search key to a plurality of entries populated in a first memory to determine an index of a matching entry to the first search key;

respectively retrieving one or more exact match indexes of the one or more second search keys from one or more exact match pattern groups populated in a second memory; and selecting a search result for the pattern from among the index output from among the first memory and the one or more exact match indexes output from the second memory.

13. The method of claim 12, wherein comparing the first search key to the plurality of entries populated in the first memory to determine the index of the matching entry to the search key further comprises:

comparing the search first key to the plurality of entries populated in a content addressable memory (CAM) to determine the index of the matching entry to the first search key.

14. The method of claim 12, wherein respectively retrieving the one or more exact match indexes of the one or more second search keys from the one or more exact match pattern groups populated in the second memory further comprises:

respectively retrieving the one or more exact match indexes of the one or more second search keys from the one or more exact match pattern groups populated in the second memory in the form of at least one of hash tables, multi-hash tables and a binary content addressable memory (BCAM).

15. The method of claim 12, wherein the comparing operation in the first memory and the retrieving operation in the second memory from the one or more exact match pattern groups are executed in parallel.

16. The method of claim 12, wherein selecting the search result for the pattern from among the index output from the first memory and the one or more exact match indexes output from the second memory further comprises:

selecting the search result according to priority information of the matching entry and the one or more exact matches.

17. The method of claim 12, further comprising:

storing an entry key with associated priority information in an entry of an exact match pattern group; and outputting an index of the entry and the priority information of the entry when the entry key matches a second search key for the exact match pattern group.

18. The method of claim 12, further comprising:

receiving a new rule with one or more classifiers, and selecting one of the first memory and the second memory to populate the new rule to maximize a usage of the second memory.

19. The method of claim 18, further comprising:

adding a new exact match pattern group in the second memory to fit the classifiers of the new rule; and moving entries in the first memory with the same classifiers as the new rule to the new exact match pattern group in the second memory.

20. The method of claim 18, further comprising:

moving a smallest exact match pattern group to the first memory in order to have enough space to add a new exact match pattern group in the second memory for the new rule.

* * * * *